(12) United States Patent
Dagan

(10) Patent No.: US 12,347,487 B2
(45) Date of Patent: *Jul. 1, 2025

(54) CURRENT AND VOLTAGE LIMIT CIRCUITRY FOR RESISTIVE RANDOM ACCESS MEMORY PROGRAMMING

(71) Applicant: Weebit Nano Ltd., Hod Hasharon (IL)

(72) Inventor: Lior Dagan, Ram-On (IL)

(73) Assignee: Weebit Nano Ltd., Hod Hasharon (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/740,981

(22) Filed: Jun. 12, 2024

(65) Prior Publication Data

US 2024/0331772 A1    Oct. 3, 2024

Related U.S. Application Data

(63) Continuation of application No. 17/646,427, filed on Dec. 29, 2021, now Pat. No. 12,040,017.

(60) Provisional application No. 63/142,770, filed on Jan. 28, 2021.

(51) Int. Cl.
 *G11C 16/04* (2006.01)
 *G11C 13/00* (2006.01)
 *H10B 63/00* (2023.01)

(52) U.S. Cl.
 CPC ......... *G11C 13/0069* (2013.01); *H10B 63/00* (2023.02); *G11C 2013/0071* (2013.01)

(58) Field of Classification Search
 CPC ................... G11C 13/0069; G11C 2013/0071
 See application file for complete search history.

(56) References Cited

U.S. PATENT DOCUMENTS

| | | | |
|---|---|---|---|
| 5,124,666 | A | 6/1992 | Liu et al. |
| 5,867,015 | A | 2/1999 | Corsi et al. |
| 6,266,276 | B1 | 7/2001 | Odani |
| 6,407,589 | B1 | 6/2002 | Wei et al. |
| 6,791,890 | B2 | 9/2004 | Ooishi |
| 7,122,997 | B1 | 10/2006 | Werking |
| 7,359,236 | B2 | 4/2008 | Gilbert |
| 7,701,184 | B2 | 4/2010 | Pan |

(Continued)

OTHER PUBLICATIONS

Azzaz, M., Vianello, E., Sklenard, B., Blaise, P., Roule, A., Sabbione, C., Bernasconi, S., Charpin, C., Cagli, C., Jalaguier, E., Jeannot, S., Denorme, S,m Candlier, P., Yu, M., Nistor, L., Fenouillet-Beranger, C., Perniola, R., "Endurance/Retention Trade Off in HfOx and TaOx Based RRAM", IEEE Internation Memory Workshop 2016, pp. 1-4. https://ieeexplore.ieee.org/document/7495268.

(Continued)

*Primary Examiner* — Pho M Luu
(74) *Attorney, Agent, or Firm* — M&B IP Analysts, LLC

(57) ABSTRACT

A programming circuitry for a resistor of a resistive random-access memory (ReRAM) is provided. The programming circuitry includes a current-limiting circuit; a current-terminating circuit including a current measurement circuit and a control circuit; and a voltage-limiting circuit, wherein the current-limiting circuit, the current-terminating circuit, and (Continued)

the voltage-limiting circuit operate in concert. Any one of the current-limiting circuit, the current-terminating circuit, and the voltage-limiting circuit may comprises an operational amplifier or a current conveyor.

24 Claims, 3 Drawing Sheets

(56) References Cited

U.S. PATENT DOCUMENTS

| | | |
|---|---|---|
| 7,764,115 B1 | 7/2010 | Fish |
| 8,928,407 B2 | 1/2015 | Miller et al. |
| 9,111,625 B2 | 8/2015 | Ong |
| 9,312,002 B2 | 4/2016 | Navon et al. |
| 9,368,207 B2 | 6/2016 | Bandyopadhyay et al. |
| 9,437,292 B1 | 9/2016 | Shih et al. |
| 9,947,401 B1 | 4/2018 | Navon et al. |
| 10,404,478 B2 | 9/2019 | Hung et al. |
| 10,469,271 B2 | 11/2019 | Hung et al. |
| 10,680,809 B2 | 6/2020 | Chang et al. |
| 10,692,575 B1 | 6/2020 | Huang |
| 10,715,340 B2 | 7/2020 | Hung et al. |
| 10,734,447 B2 | 8/2020 | Ando et al. |
| 10,749,695 B2 | 8/2020 | Hung et al. |
| 10,838,444 B1 | 11/2020 | Rustamov |
| 10,855,477 B2 | 12/2020 | Hung et al. |
| 11,024,379 B2 | 6/2021 | Sharma et al. |
| 12,040,017 B2* | 7/2024 | Dagan .................... H10B 63/00 |
| 2022/0284955 A1 | 9/2022 | Dagan et al. |
| 2023/0096127 A1* | 3/2023 | Dagan ................ G11C 13/0028 365/148 |
| 2023/0136097 A1* | 5/2023 | Tian .................... H10N 70/841 257/2 |

OTHER PUBLICATIONS

Levisse, A., Bocquet, M., Alayan, M., Moreau, M., Nowak, E., Molas, G., Vianello, E., Atienza, D. and Portal, J-E., "Write Termination Circuits for RRAM: A Holistic Approach from Technology to Application Considerations", DOI 10.1109/ACCESS.2020. 3000867, IEEE Access, pp. 1-13. https://ieeexplore.ieee.org/document/ 9110858.

Ramadan, M., Wainstein, N., Ginosar, R and Kvatinsky, S., "Adaptive Programming in Multi-Level Cell ReRAM", Microelectronics Journal, Jun. 15, 2019, pp. 1-16. https://www.sciencedirect.com/ science/article/abs/pii/S0026269218308334#:~:text=This%20is% 20undesirable%20for%20using%20the%20memristors%20as,MLC% 20levels%2C%20by%20effectively%20linearizing%20the% 20memristive%20behavior.

\* cited by examiner

CURRENT AND VOLTAGE LIMIT CIRCUITRY FOR RESISTIVE RANDOM ACCESS MEMORY PROGRAMMING

CROSS-REFERENCE TO RELATED APPLICATIONS

The present application is a continuation of U.S. Pat. No. 12,040,017 filed Dec. 29, 2021, now allowed and entitled "Current and Voltage Limit Circuitry for Resistive Random Access Memory Programming", which claims the priority benefit of U.S. Provisional Application No. 63/142,770 filed on Jan. 28, 2021, the contents of which are hereby incorporated by reference in their entirety.

TECHNICAL FIELD

The present disclosure generally relates to resistive random-access memory (ReRAM) arrays, and more particularly to the control of the electrical field developing over the resistor of a ReRAM cell during programming.

BACKGROUND

In the related art, there are many types of known non-volatile random-access memory (RAM) cells. These kinds of memory cells allow the random access to each memory cell, or group of cells if so configured, and ensure that the data is retained in the memory cell even when power is lost. A certain class of these memory cells is known by the name resistive RAM (ReRAM) cells. In these cells, data are stored by changing the resistance of a dielectric solid-state material. To this end, programming of the resistive element, also referred to as the resistor, is a critical component for efficiently and reliably operating the ReRAM cells.

The programming includes three possibilities, forming which is the initial programming of the ReRAM's resistor from its pristine condition, as well as set and reset, thereafter. Forming of the cell involves creating a filament which thereafter may be reset, or broken, for the purpose of creating a high resistance, or set, so that low resistance is achieved. Although there are various advantages in ReRAM, there are certain data writing or programming challenges that need to be overcome.

Particularly, overstressing is a challenge of concern which can eventually cause damaging of the ReRAM cells. Overstressing can be caused by, for example, inconsistencies in programming speed between the ReRAM cells, large voltage-drop and/or current across the ReRAM cells, and more. Large current flow can be highly problematic in that defects are created from the flow of electrons and over-heating. Moreover, high current can increase the temperature of the ReRAM through Joule heating, which in return can increase the current even more. Such increase in current can lead to undesirably large filaments and may also induce local damages to the material.

Certain conventional methods address portions of such damaging issues, such as achieving constant voltage-drop, however, such limited approach still fall short. Moreover, the challenges noted above further increase with technological advancement as feature size is reduced and hence the risk of damaging the resistive filament of the ReRAM cell increases.

It would therefore be advantageous to provide a solution that would overcome challenges and deficiencies noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a programming circuitry for a resistor of a resistive random-access memory (ReRAM). The programming circuitry comprises: a current-limiting circuit; a current-terminating circuit including a current measurement circuit and a control circuit; and a voltage-limiting circuit, wherein the current-limiting circuit, the current-terminating circuit, and the voltage-limiting circuit operate in concert; and wherein any one of: the current-limiting circuit, the current-terminating circuit, and the voltage-limiting circuit comprise an operational amplifier.

Certain embodiments disclosed herein include a programming circuitry for a resistor of a resistive random-access memory (ReRAM). The programming circuitry comprises: a current-limiting circuit; a current-terminating circuit including a current measurement circuit and a control circuit; and a voltage-limiting circuit, wherein the current-limiting circuit, the current-terminating circuit, and the voltage-limiting circuit operate in concert; and wherein any one of: the current-limiting circuit, the current-terminating circuit, and the voltage-limiting circuit comprises a current conveyor.

Certain embodiments disclosed herein also include a non-volatile memory, comprising: an array of resistive random-access memory (ReRAM) including a plurality of ReRAM cells, wherein each ReRAM cell includes at least a ReRAM resistor; and at least a programming circuitry coupled to the at least a ReRAM resistor, wherein the programming circuitry includes a current-limiting circuit, a current-terminating circuit, and a voltage-limiting circuit, wherein the current-limiting circuit, the current-terminating circuit, and the voltage-limiting circuit operate in concert; wherein any one of: the current-limiting circuit, the current-terminating circuit, and the voltage-limiting circuit comprises an operational amplifier.

Certain embodiments disclosed herein also include a non-volatile memory, comprising: an array of resistive random-access memory (ReRAM) including a plurality of ReRAM cells, wherein each ReRAM cell includes at least a ReRAM resistor; and at least a programming circuitry coupled to the at least a ReRAM resistor, wherein the programming circuitry includes a current-limiting circuit, a current-terminating circuit, and a voltage-limiting circuit, wherein the current-limiting circuit, the current-terminating circuit, and the voltage-limiting circuit operate in concert; wherein any one of: the current-limiting circuit, the current-terminating circuit, and the voltage-limiting circuit comprises a current conveyor.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
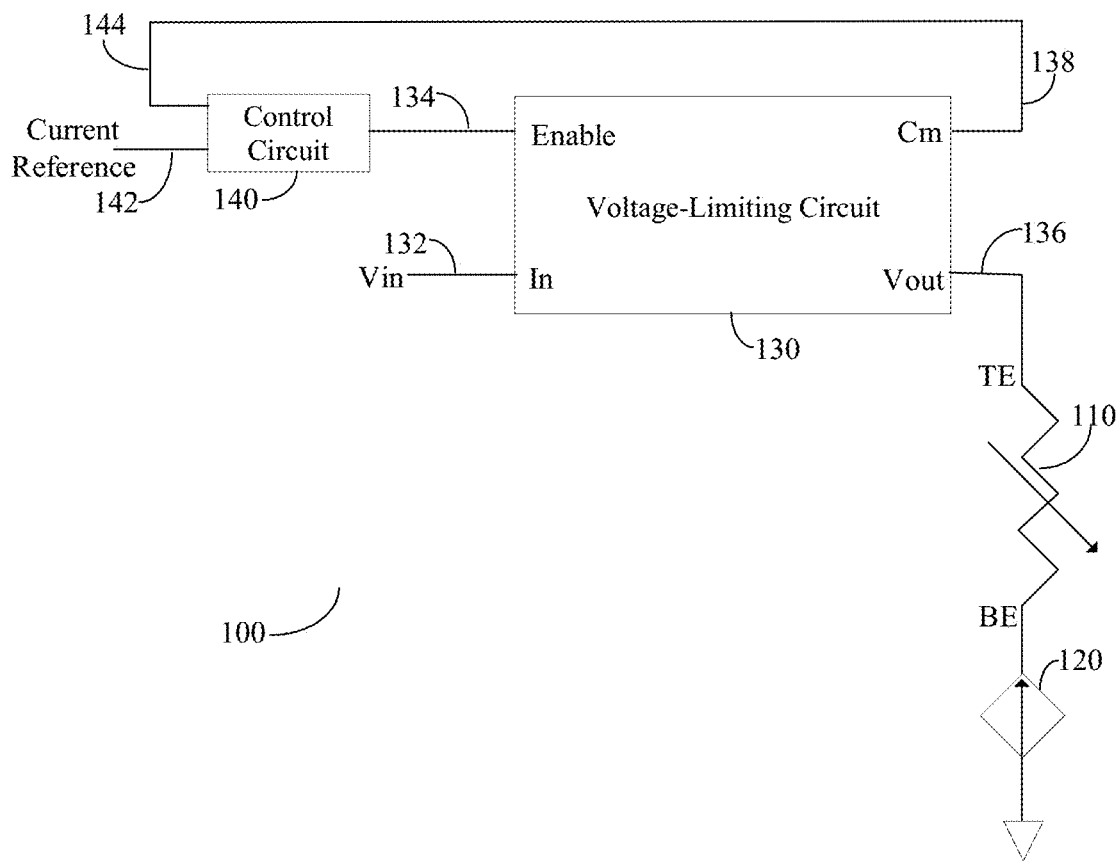
FIG. 1 is a schematic diagram of a circuitry for set-programming a resistive element of a resistive random-access memory (ReRAM) according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The term "programming" may refer herein to the initial setting of the resistor from its pristine condition, also known as forming of the ReRAM resistor. It may further refer to either set or reset of the ReRAM resistor. The discussion below is about either the form-programming (i.e., creating or forming a filament) or set-programming (i.e., set resistor to low resistive value) of the ReRAM resistive element. However, it should be appreciated that the circuits may be so adapted to also handle reset-programming (i.e., reset resistor to high resistive value) without departing from the scope of the present disclosure. It should be noted that while the term "programming" is used herein, the term "writing" may and is frequently used to describe the same operation, i.e., updating the content of a memory cell.

The resistive element of a resistive random-access memory (ReRAM) is subject to risks of failure due to, for example, high electrical field during a set programming. This is especially a problem when many bits are programmed, and some have already reached their desirable resistance while others are still in process of being set. Accordingly, a ReRAM's resistor programming circuitry includes a current-limiting circuit, a current-terminating circuit, and a voltage-limiting circuit. These circuits operate in concert in order to limit and/or control the electrical field across a ReRAM resistor, and the filament of the resistor, at time of set programming and thus, reduce risk of damage to the resistor filament, reduce power consumption, and increase programming speed.

FIG. 1 is an example schematic diagram of a circuitry 100 for set-programming a resistive element 110 of a resistive random-access memory (ReRAM) according to an embodiment. The current through the resistive element 110 of a ReRAM cell (not shown) is current limited by current-limiting circuit 120. The current-limiting circuit 120 is designed to limit the maximum current flowing through the resistive element 110 during set-programming. It is typically connected to the bottom electrode (BE) of the resistive element 110. A voltage-limiting circuit 130 provides a voltage output port Vout 136 that is connected to the top electrode (TE) of the resistive element 110 and provides the set-programming voltage to the resistive element 110.

In an embodiment, the voltage-limiting circuit 130 may include an operational amplifier (not shown) or a current conveyor (not shown). The voltage-limiting circuit 130 is controlled by an enable input 134 that can activate or deactivate the voltage-limiting circuit 130. Another input 132 of the voltage-limiting circuit 130 provides a voltage reference Vin. Another output of the voltage-limiting circuit 130 provides a signal Cm 138 that is proportional to the current consumed by the Vout port of the voltage-limiting circuit 130.

A control circuit 140, when powered, receives the Cm 138 signal at input 144 and compares it to a reference current provided at input 142 of the control circuit 140. When the measured current at input 144 exceeds the reference current at 142, the voltage-limiting circuit 130 is disabled. It should be appreciated that the circuitry 100 provides for current termination, current limitation, and voltage limitation operating in concert to control the set-programming of the resistive element 110, avoiding the current and voltage excesses common to prior art solutions. That is, current limitation provides for prevention of over-set of the resistive element 110. Moreover, in the embodiment, the voltage level is limited for level set-programming. The current termination controls power consumption, i.e., reduces power consumption by the ReRAM when being programmed, and further provides additional endurance as overstressing of the resistive element 110 is avoided. In an embodiment, the current-limiting circuit 120 further includes an enable signal port (not shown) that allows the enable output of control circuit 140 to enable the operation of the current-limiting circuit 120.

Figure 2:
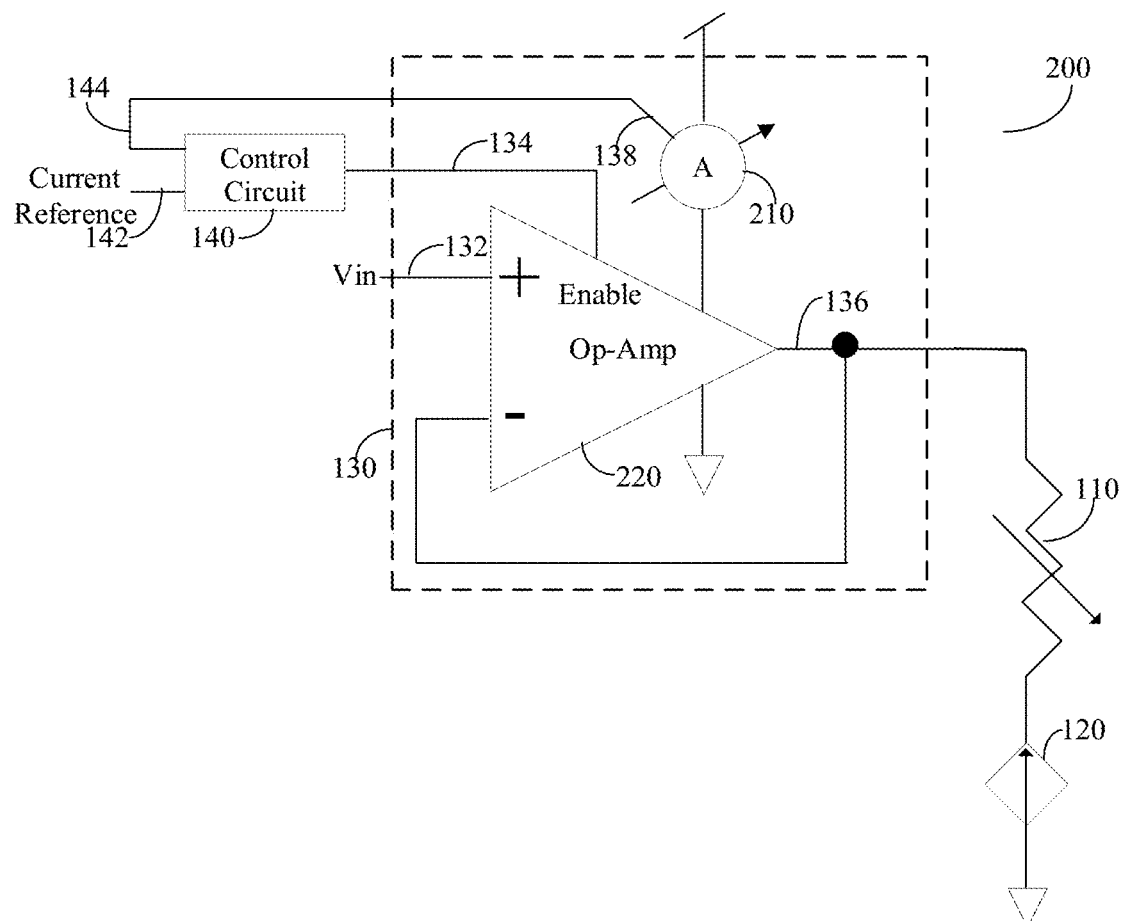
FIG. 2 is a schematic diagram of the circuitry for set-programming a resistive element of a ReRAM using an operational amplifier according to an embodiment.

FIG. 2 is an example schematic diagram of a circuitry 200 for set-programming a resistive element of a resistive random-access memory (ReRAM) using an operational amplifier 220 according to an embodiment. The output of the operational amplifier (op-amp) 220 is connected to the TE of the resistive element 110 of the ReRAM cell, and a current-limiting circuit 120 is connected to the BE of the resistive element 110. The current-limiting circuit 120 allows current therethrough to increase as the resistance of the resistive element 110 decreases but prevents the current from exceeding a predetermined threshold current.

The current measurement is performed by measuring the current which op-amp 220 supplies the resistive element 110, by the current measurement circuit 210. The current measurement circuit 210 provides a signal 138 to the control circuit 140 at input 144. When the measurement exceeds a current-reference value provided at input 142 of the control circuit 140, the op-amp 220 is disabled and programming ceases. The op-amp 220 reflects the input voltage at 132 and at the output 136 of the op-amp 220. Hence, the current limitation is provided by the current-limiting circuit 120, the voltage limitation is provided by the op-amp 220, and the current termination by the current measurement circuit 210 and the control circuit 140 that terminates the set-programming operation upon the current exceeding a reference current (or predetermined threshold current).

In an embodiment, the current measurement may be taken by connecting a current measurement circuit 210 to the BE of the resistive element 110, and further connecting the current-limiting circuit 120 instead of the current measurement circuit 210 as shown in FIG. 2. Such changes should be considered as not outside of the scope of the present disclosure. As noted above, certain configurations of the circuitry 200 may use a current conveyor (not shown), mutatis mutandis, instead of the op-amp 220.

As noted above, control of the electrical field experienced by the filament of the resistive element 110 may be desired to prevent from having a filament which is too thick or otherwise subject to damage resulting from over-heating from a current that exceeds limitation in both current levels as well as the amount of time current flows through the filament of the resistive element 110. During set-programming, the voltage remains constant and the resistance decreases. As a result, heat dramatically increases in proportion of $V^2/R$. The reason for having a current-terminating circuit when there is a current-limiting circuit 120, or vice versa, is that termination takes longer than current limitation. The longer delay is due to the inherent delay of the current sensor as it has to sense the current, reach a decision, and then deactivate the enable signal 134 to trigger the termination. The current limitation response time is significantly faster as no feedback process is necessary.

Moreover, the current-terminating circuit enables control over the spread of different resistive elements 110 of the ReRAM cells which may have response times that significantly differ from one another. Some of the cells may change at times that take 2-3 times longer than the fastest resistive elements 110 of other ReRAM cells. Even while current limitation is effective, damages to the filament may be observed. Therefore, by implementing a current-terminating circuit, current may cease to flow. thereby saving on power as well as enhancing endurance by avoiding the continued supply of current through the resistive element 110. Hence, the circuits provided herein may prevent damages resulting from excess current flowing through the filament and reduce the potential of excess electrical field applied between the TE and BE of the resistive element 110. Furthermore, as a result of the circuitry 200 operation at set-programming, when applied over the many ReRAM cells of a memory array, the average set-programming current consumption per bit may be reduced.

Figure 3:
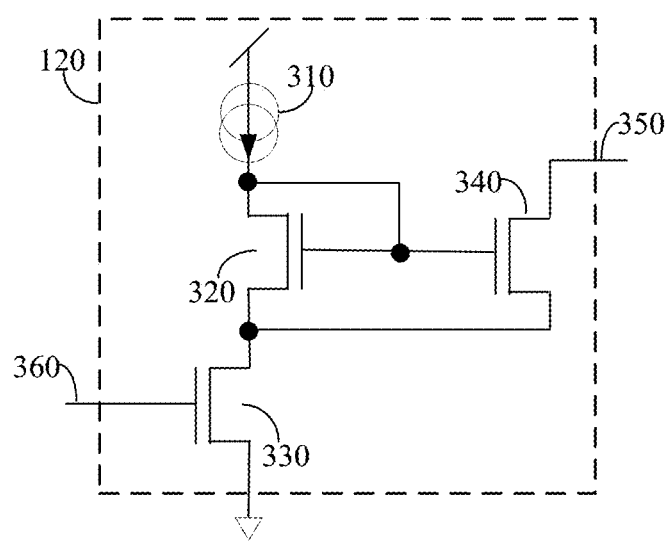
FIG. 3 is a schematic diagram of a current-limiting circuit of the circuitry for set-programming a resistive element of a ReRAM according to an embodiment.

FIG. 3 is an example schematic diagram of a current-limiting circuit 120 of the circuitry for set-programming a resistive element of a ReRAM according to an embodiment. The current-limiting circuit 120 shown herein may use a reference current 310 modeled as an ideal current source which is mirrored to the output upon receiving an enable signal 360 that activates an N-channel field-effect transistor (N-FET) 330. The current mirror, including N-FET 320 and N-FET 340, has a finite output resistance, and has little effect on the ReRAM resistor when the ReRAM is in a high-resistance state (HRS). And thus, most of the voltage drop is on the ReRAM. When the ReRAM transitions to low-resistance state (LRS), the current is limited because the current mirror stops current by the natural increasing of the transistor's drain-source voltage (VDS), thereby reducing the voltage drop on the ReRAM resistor. It should be noted that the enable signal 360 may be provided from the enable signal 134 (FIG. 1) provided by the control circuit 140 (FIG. 1). The port 350 connects to the BE of the ReRAM resistor 110. It should be noted that this is an example of a current-limiting circuit 120 and should not be viewed as limiting upon the scope of the disclosed embodiments.

Figure 4:
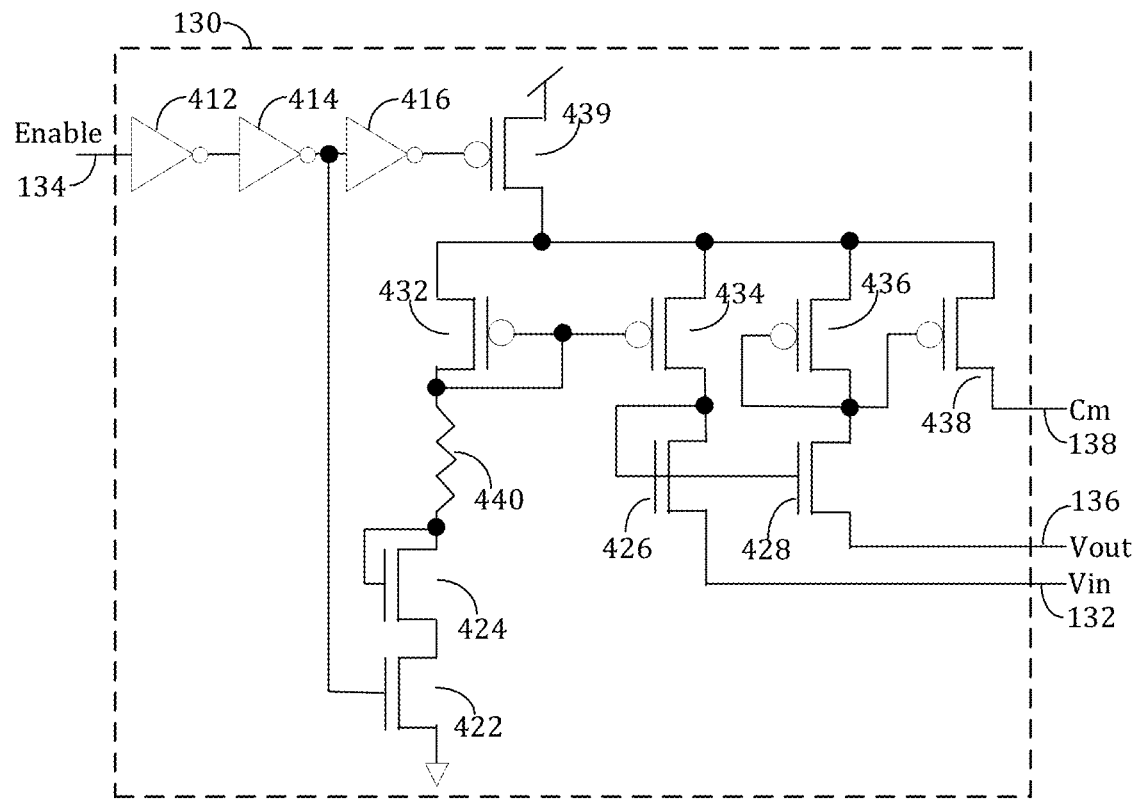
FIG. 4 is a schematic diagram of a voltage-limiting circuit of the circuitry for set-programming a resistive element of a ReRAM using a current conveyor according to an embodiment.

FIG. 4 is an example schematic diagram of a voltage-limiting circuit 130 of the circuitry for set-programming a resistive element of a ReRAM using a current conveyor according to an embodiment. It should be noted that this is an example of a current conveyor and should not be viewed as limiting upon the scope of the disclosed embodiments. In an embodiment, a resistor 440 may create a current bias (432, 440, 424) that is mirrored to the current mirror (434). 426 and 428 each have a roughly VT drop, where VT is the threshold voltage of the transistor, making Vin 132 and Vout 136 very similar. The current mirror 434 gives the high impedance of the 132 port with respect to the 136 port, hence acting as a voltage capture, and the Vout is a good current capture that can follow the Vin 132 voltage. Current of Vout is then, measured by a p-channel field-effect transistor (P-FET) 436, and mirrored by a P-FET 438 in order to provide Cm 138 current for the termination. The Cm 138 provides the current measurement feedback used by the circuitry 100.

It should be noted that this is an example of such a control circuitry 140 and should not be viewed as limiting upon the scope of the disclosed embodiments. In an example embodiment, the enable signal 134 may be buffered by two inverters 412, 414 before being fed into an N-type metal oxide semiconductor (N-MOS) 422. The N-MOS 422 and the P-MOS 439 may function as switches controlled by the enable signal 134. In another example embodiment, the inverters 412 and 414 may be omitted and the enable signal 134 may be connected directly to the input of inverter 416 as well as to the N-MOS 422, without departing from the scope of the disclosed embodiments.

Figure 5:
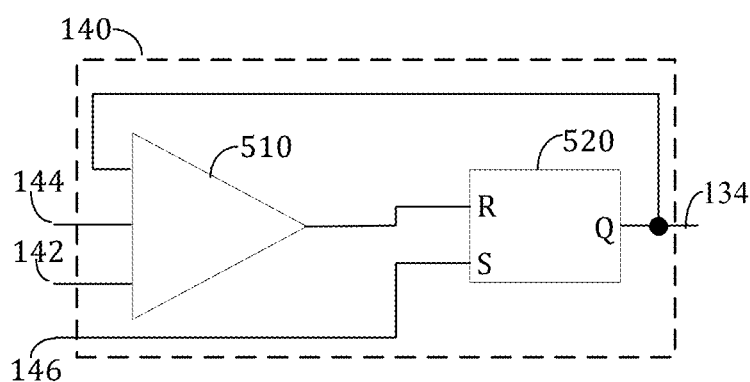
FIG. 5 is a schematic diagram of a control circuit of the circuitry for set-programming a resistive element of a ReRAM according to an embodiment.

FIG. 5 is an example schematic diagram of a control circuit 140 of the circuitry for set-programming a resistive element of a ReRAM according to an embodiment. A comparator 510 receives a current reference at port 142 and at port 144 the Cm 138 from the voltage-limiting circuit 130 (FIG. 1). The control circuit 140 receives a pulse of "1" to the "S" port 146 of the set-reset flip flop (SR-FF) 520, and enables the internal comparator 510 and the voltage-limiting circuit 130. When the cell current is higher than the reference current, the comparator toggles from "0" to "1", causing both comparator 510 and voltage-limiting circuit 130 to shut-down.

According to an embodiment, a set-programming circuitry for a resistor of a ReRAM includes the following circuits: a ReRAM resistor programming current-limiting circuit; a ReRAM resistive element (may also be referred to as resistor) programming current-terminating circuit; and a ReRAM resistive element programming voltage-limiting circuit. These circuits operate to ensure that a maximum electrical field over the ReRAM resistive element is controlled by the programming circuitry. Furthermore, the current-limiting circuit, the current-terminating circuit, and the voltage-limiting circuit are designed to operate in concert.

In an embodiment, the programming circuit may employ an operational amplifier. In another embodiment, the programming circuit may employ a current conveyor. It should be appreciated that while the circuits discussed herein are for a set operation, it would be possible to adapt the circuits such that they would apply for reset operation of the ReRAM resistor without departing from the scope of the disclosed embodiments. In an embodiment, switching the operation between the TE and BE of the ReRAM resistor 110 may be achieved by either current diversion circuits or, by applying logic inversion.

In another embodiment, a non-volatile memory including an array (not shown) of ReRAM cells has one or more control circuitry 100 for the purpose of set-programming of resistive elements of ReRAM cells of the array according to the principles disclosed herein. In an embodiment, certain switching and control circuitry (both not shown) may be configured to achieve an optimal number of the one or more control circuitry 100 within such a ReRAM array of the non-volatile memory. An ordinary skill in the art would appreciate that the disclosed embodiments described herein may be applied to various ReRAM implementations without departing from the scope, including, but not limited to, the like of one-transistor one-resistor (1T1R), two-transistor one-resistor (2T1R), two-transistor two-resistor (2T2R), and crossbar configurations.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; 2A; 2B; 2C; 3A; A and B in combination; B and C in combination; A and C in combination; A, B, and C in combination; 2A and C in combination; A, 3B, and 2C in combination; and the like.

What is claimed is:

1. A programming circuitry for a resistor of a resistive random-access memory (ReRAM), comprising:
   a current-limiting circuit;
   a current-terminating circuit including a current measurement circuit and a control circuit; and
   a voltage-limiting circuit,
   wherein the current-limiting circuit, the current-terminating circuit, and the voltage-limiting circuit operate in concert; and
   wherein any one of: the current-limiting circuit, the current-terminating circuit, and the voltage-limiting circuit comprise an operational amplifier.

2. The programming circuitry of claim 1, wherein each of the current-limiting circuit, the current-terminating circuit, and the voltage-limiting circuit is the ReRAM resistor programming circuitry.

3. The programming circuitry of claim 1, wherein at least a maximum electrical field over the ReRAM resistor is controlled by the programming circuitry.

4. The programming circuitry of claim 1, wherein any of: the current-limiting circuit, the current-terminating circuit, and the voltage-limiting circuit comprises a current conveyor.

5. The programming circuitry of claim 1, wherein at least a maximum current through the ReRAM resistor is limited by the current-limiting circuit.

6. The programming circuitry of claim 1, wherein programming involves at least one of: forming, set-programming, and reset-programming.

7. The programming circuitry of claim 1, wherein the programming circuitry is connected to at least one ReRAM cell of a plurality of ReRAM cells of a ReRAM array of cells.

8. A programming circuitry for a resistor of a resistive random-access memory (ReRAM), comprising:
   a current-limiting circuit;
   a current-terminating circuit including a current measurement circuit and a control circuit; and
   a voltage-limiting circuit,
   wherein the current-limiting circuit, the current-terminating circuit, and the voltage-limiting circuit operate in concert; and
   wherein any one of: the current-limiting circuit, the current-terminating circuit, and the voltage-limiting circuit comprises a current conveyor.

9. The programming circuitry of claim 8, wherein each of the current-limiting circuit, the current-terminating circuit, and the voltage-limiting circuit is the ReRAM resistor programming circuitry.

10. The programming circuitry of claim 8, wherein at least a maximum electrical field over the ReRAM resistor is controlled by the programming circuitry.

11. The programming circuitry of claim 8, wherein any of: the current-limiting circuit, the current-terminating circuit, and the voltage-limiting circuit comprises an operational amplifier.

12. The programming circuitry of claim 8, wherein at least a maximum current through the ReRAM resistor is limited by the current-limiting circuit.

13. The programming circuitry of claim 8, wherein programming involves at least one of: forming, set-programming, and reset-programming.

14. The programming circuitry of claim 8, wherein the programming circuitry is connected to at least one ReRAM cell of a plurality of ReRAM cells of a ReRAM array of cells.

15. A non-volatile memory, comprising:
   an array of resistive random-access memory (ReRAM) including a plurality of ReRAM cells, wherein each ReRAM cell includes at least a ReRAM resistor; and
   at least a programming circuitry coupled to the at least a ReRAM resistor, wherein the programming circuitry includes a current-limiting circuit, a current-terminating circuit, and a voltage-limiting circuit, wherein the current-limiting circuit, the current-terminating circuit, and the voltage-limiting circuit operate in concert;
   wherein any one of: the current-limiting circuit, the current-terminating circuit, and the voltage-limiting circuit comprises an operational amplifier.

16. The non-volatile memory of claim 15, wherein at least a maximum electrical field over the at least a ReRAM resistor is controlled by the at least a programming circuitry.

17. The non-volatile memory of claim 15, wherein any one of: the current-limiting circuit, the current-terminating circuit, and the voltage-limiting circuit comprises a current conveyor.

18. The non-volatile memory of claim 15, wherein at least a maximum current through the ReRAM resistor is limited by the current-limiting circuit.

19. The non-volatile memory of claim 15, wherein programming involves at least one of: forming, set-programming, and reset-programming.

20. A non-volatile memory, comprising:
- an array of resistive random-access memory (ReRAM) including a plurality of ReRAM cells, wherein each ReRAM cell includes at least a ReRAM resistor; and
- at least a programming circuitry coupled to the at least a ReRAM resistor, wherein the programming circuitry includes a current-limiting circuit, a current-terminating circuit, and a voltage-limiting circuit, wherein the current-limiting circuit, the current-terminating circuit, and the voltage-limiting circuit operate in concert;
- wherein any one of: the current-limiting circuit, the current-terminating circuit, and the voltage-limiting circuit comprises a current conveyor.

21. The non-volatile memory of claim 20, wherein at least a maximum electrical field over the at least a ReRAM resistor is controlled by the at least a programming circuitry.

22. The non-volatile memory of claim 20, wherein any one of: the current-limiting circuit, the current-terminating circuit, and the voltage-limiting circuit comprises an operational amplifier.

23. The non-volatile memory of claim 20, wherein at least a maximum current through the ReRAM resistor is limited by the current-limiting circuit.

24. The non-volatile memory of claim 20, wherein programming involves at least one of: forming, set-programming, and reset-programming.

* * * * *